(12) United States Patent
Yamashita et al.

(10) Patent No.: US 11,476,231 B2
(45) Date of Patent: Oct. 18, 2022

(54) SEMICONDUCTOR DEVICE

(71) Applicant: Kioxia Corporation, Tokyo (JP)

(72) Inventors: Shinji Yamashita, Yokohama (JP); Soichiro Ibaraki, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/116,420

(22) Filed: Dec. 9, 2020

(65) Prior Publication Data

US 2022/0045032 A1 Feb. 10, 2022

(30) Foreign Application Priority Data

Aug. 6, 2020 (JP) .............................. JP2020-134076

(51) Int. Cl.
*H01L 25/065* (2006.01)
(52) U.S. Cl.
CPC ...... *H01L 25/0652* (2013.01); *H01L 25/0657* (2013.01); *H01L 2225/0651* (2013.01); *H01L 2225/06506* (2013.01); *H01L 2225/06524* (2013.01); *H01L 2225/06562* (2013.01); *H01L 2225/06586* (2013.01)
(58) Field of Classification Search
CPC .................................................. H01L 25/0657
See application file for complete search history.

(56) References Cited

U.S. PATENT DOCUMENTS

| | | | |
|---|---|---|---|
| 7,381,635 B2 | 6/2008 | Cabral, Jr. et al. | |
| 9,099,999 B1 | 8/2015 | Wang et al. | |
| 2011/0089553 A1 | 4/2011 | Kim et al. | |
| 2015/0171066 A1 | 6/2015 | Yamamichi et al. | |
| 2019/0245543 A1 | 8/2019 | Lee et al. | |
| 2020/0075505 A1* | 3/2020 | Seto ...................... | H01L 23/556 |
| 2020/0091087 A1 | 3/2020 | Yamashita et al. | |
| 2020/0303290 A1 | 9/2020 | Fujimori et al. | |

FOREIGN PATENT DOCUMENTS

JP  9-36315 A  2/1997
JP  2009-507361 A  2/2009

* cited by examiner

*Primary Examiner* — Yu-Hsi D Sun
(74) *Attorney, Agent, or Firm* — Oblon, McClelland, Maier & Neustadt, L.L.P.

(57) ABSTRACT

A semiconductor device according to the present embodiment includes a wiring substrate. A semiconductor chip includes a semiconductor substrate having a first face and a second face on the opposite side to the first face, and an SRAM on the side of the first face, and is stuck to the wiring substrate on the side of the second face. The semiconductor chip includes a first metallic layer provided in the semiconductor substrate between the SRAM and the wiring substrate.

18 Claims, 7 Drawing Sheets

SEMICONDUCTOR DEVICE

CROSS REFERENCE TO RELATED APPLICATIONS

This application is based upon and claims the benefit of priority from the prior Japanese Patent Application No. 2020-134076, filed on Aug. 6, 2020, the entire contents of which are incorporated herein by reference.

FIELD

The embodiments of the present invention relate to a semiconductor device.

BACKGROUND

With increase in the size of a system of a semiconductor device, an SRAM (Static Random Access Memory) that temporarily stores data therein is increased in the capacity and is lowered in the voltage. When an SRAM is downscaled to increase the capacity and lower the voltage, a soft error rate (FIT (Failure In Time)) per unit cell of the SRAM is increased.

DETAILED DESCRIPTION

Figure 1:
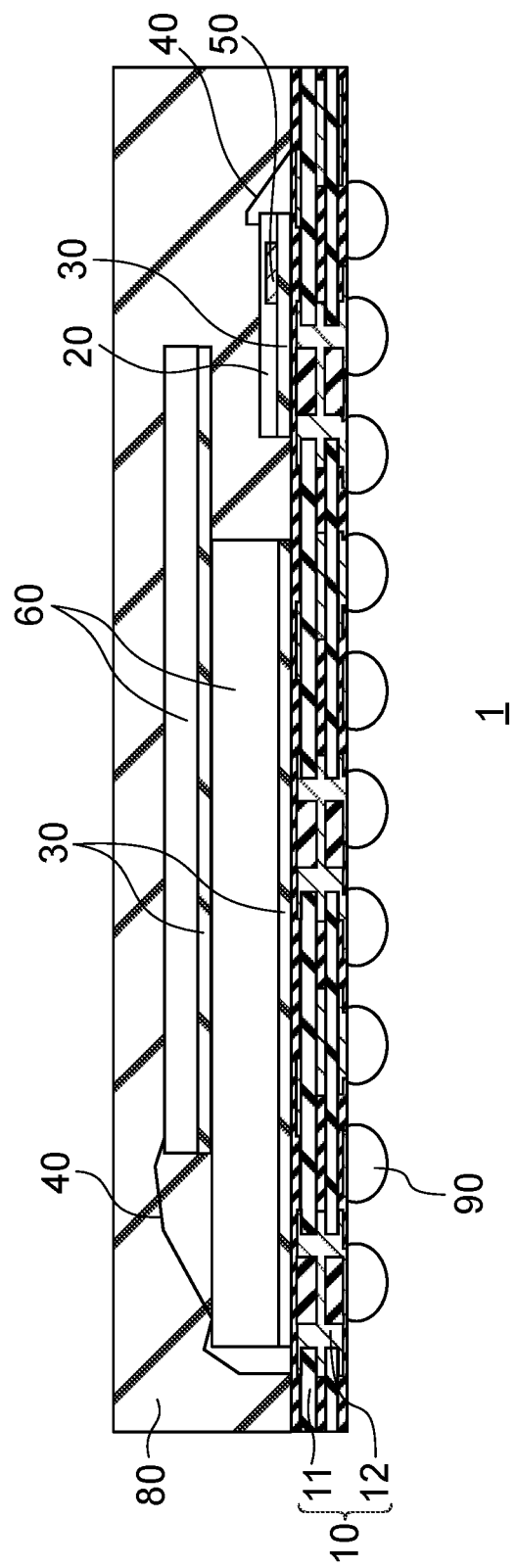
FIG. 1 is a sectional view illustrating a configuration example of a semiconductor device according to an embodiment.

Embodiments will now be explained with reference to the accompanying drawings. The present invention is not limited to the embodiments. In the embodiments, "an upper direction" or "a lower direction" refers to a relative direction when a direction perpendicular to a surface of a substrate on which semiconductor chips are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to the present embodiment includes a wiring substrate. A semiconductor chip includes a semiconductor substrate having a first face and a second face on the opposite side to the first face, and an SRAM on the side of the first face, and is stuck to the wiring substrate on the side of the second face. The semiconductor chip includes a first metallic layer provided in the semiconductor substrate between the SRAM and the wiring substrate.

Figure 13:
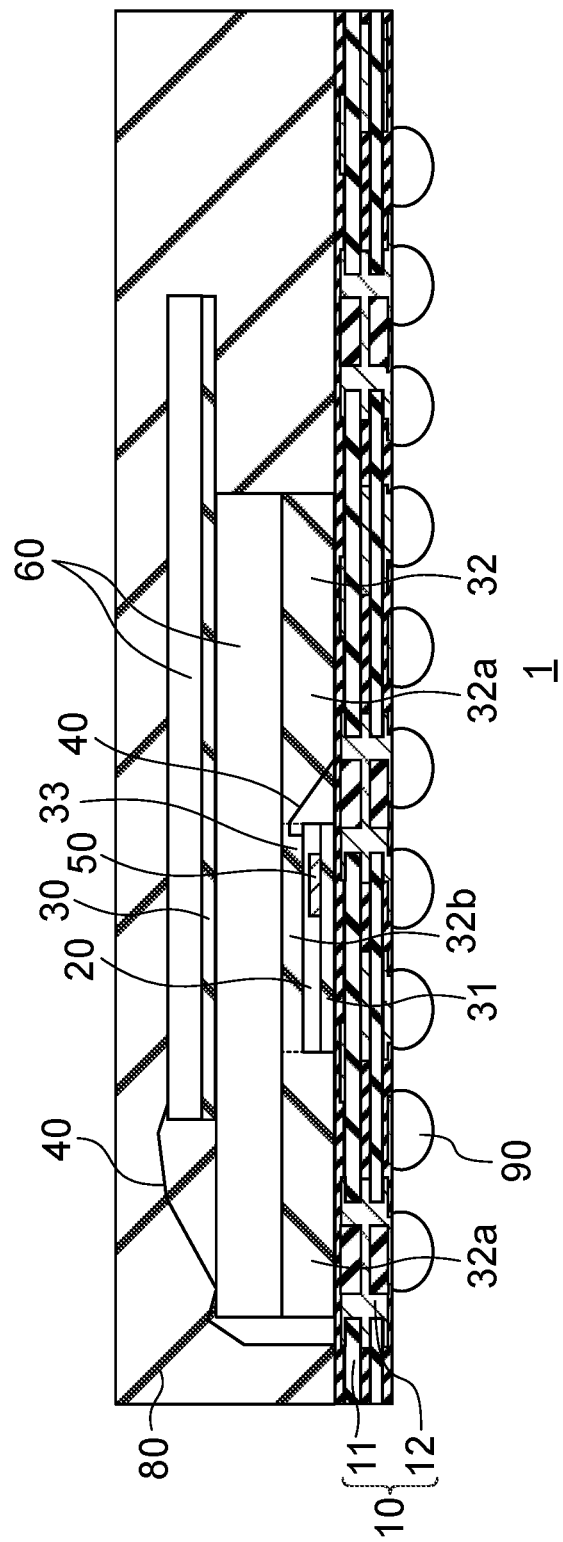
FIG. 13 is a sectional view illustrating a configuration example of the semiconductor device according to the embodiment.

FIG. 1 and FIG. 13 are sectional views respectively illustrating a configuration example of a semiconductor device 1 according to the present embodiment.

The semiconductor device 1 includes a wiring substrate 10, a controller chip 20, adhesive layers 30, metallic wires 40, a metallic layer 50, memory chips 60, a resin layer 80, and metallic bumps 90.

The semiconductor device 1 is, for example, a semiconductor package in which the memory chips 60 and the controller chip 20 are mounted on the wiring substrate 10 and are sealed with the resin layer 80. The semiconductor package may be, for example, a BGA (Ball Grid Array) or an LGA (Land Grid Array).

The wiring substrate 10 is configured by stacking a plurality of resin layers 11 and a plurality of wiring layers 12. For example, a glass material and a resin material are used as the resin layers 11. For example, the resin layers 11 may be glass epoxy resin, which is glass fiber containing epoxy resin. For example, a low-resistance metal such as copper or tungsten is used as the wiring layers 12. Alpha rays are emitted from the resin layers 11, for which such a glass material is used. The alpha rays are likely to adversely affect data that is latched in an SRAM in the controller chip 20 and cause soft errors.

The memory chips 60 are, for example, semiconductor chips on which a NAND flash memory is mounted. The controller chip 20 is, for example, a semiconductor chip that controls the memory chips 60. The memory chips 60 and the controller chip 20 are mounted on the same wiring substrate 10 and are sealed by the resin layer 80. The semiconductor device 1 is thereby configured as one semiconductor package. A single memory chip 60 may be mounted on the wiring substrate 10, or a plurality of memory chips 60 may be stacked on the wiring substrate 10. Other semiconductor chips may be further mounted on the wiring substrate 10. The semiconductor device 1 may be a different LSI (LargeScale Integrated circuit) other than the memory.

The controller chip 20 and the memory chips 60 are stuck onto the wiring substrate 10 by the associated adhesive layers 30. In FIG. 1, two memory chips 60 are stacked and are stuck to each other with the adhesive layer 30. Three or more memory chips 60 may be stacked or only one memory chip 60 may be stuck onto the wiring substrate 10. In the present embodiment, the controller chip 20 is not provided on the memory chips 60 and is provided above the wiring substrate 10 via the adhesive layer 30. The controller chip 20 and the memory chips 60 are respectively electrically connected to any of the wiring layers 12 of the wiring substrate 10 via the associated metallic wires 40. For example, a resin material such as a DAF (Die Attachment Film) is used as the adhesive layers 30. For example, a low-resistance metal such as gold is used as the metallic wires 40.

As illustrated in FIG. 1, the controller chip 20 may be arranged in a region different from a region on the wiring substrate 10 where the memory chips 60 are provided. Alternatively, the controller chip 20 may be provided below the memory chips 60 in the region on the wiring substrate 10 where the memory chips 60 are provided as illustrated in FIG. 13. That is, the controller chip 20 may be provided between the wiring substrate 10 and the memory chips 60.

An adhesive layer 31 (a first adhesive part) adheres between the back surface F2 of the controller chip 20 and the wiring substrate 10. An adhesive layer 32 includes a second adhesive part 32a and a third adhesive part 32b. The dotted line in FIG. 13 indicates a boundary between the second adhesive part 32a and the third adhesive part 32b. The second adhesive part 32a adheres the memory chip 60 to the wiring substrate 10. The third adhesive part 32b adheres the surface F1 of the controller chip 20 to the memory chip 60. The adhesive layers 31 and 32 may be made of the same resin material (for example, DAF).

The metallic bumps 90 are provided on the back surface of the wiring substrate 10. The metallic bumps 90 are respectively connected to any of the wiring layers 12 and are electrically connected to the memory chips 60 or the control chip 20 via the wiring substrate 10 and the metallic wires 40. For example, a low-resistance metal such as solder is used as the metallic bumps 90.

The metallic layer 50 is provided in the controller chip 20. A configuration of the controller chip 20 and the metallic layer 50 is explained later with reference to FIGS. 2 and 3.

Figure 2:
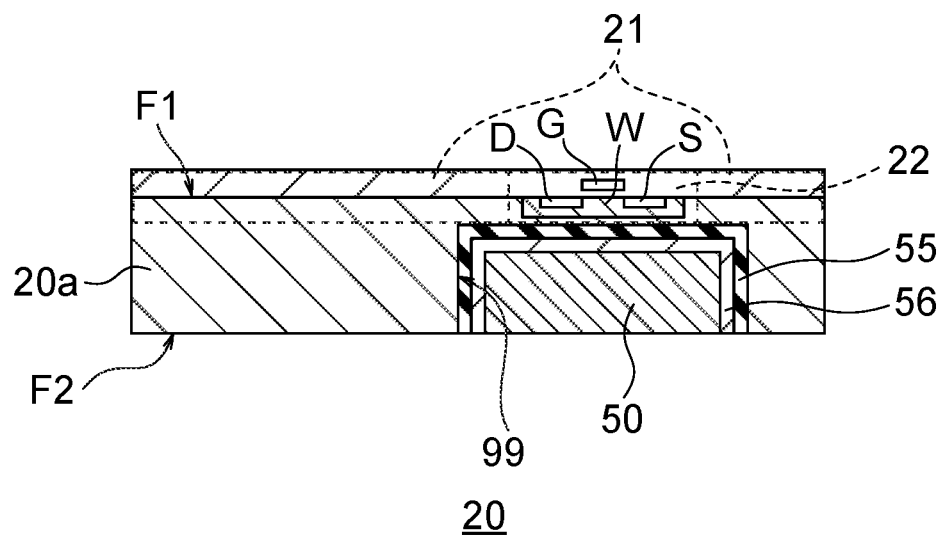
FIG. 2 is a sectional view illustrating a configuration example of a controller chip and a metallic layer.
Figure 3:
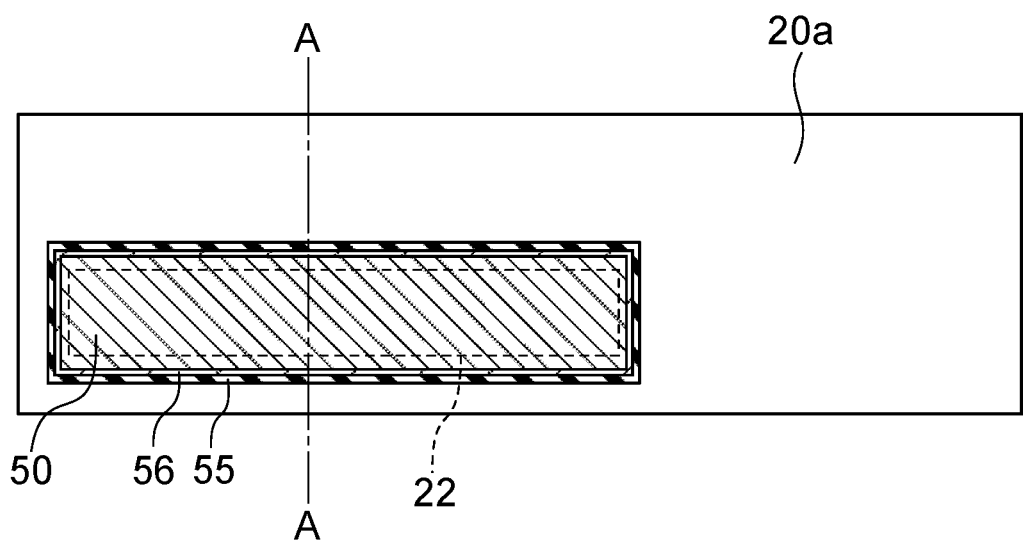
FIG. 3 is a plan view illustrating a configuration example of the controller chip and the metallic layer.

FIG. 2 is a sectional view illustrating a configuration example of the controller chip 20 and the metallic layer 50. FIG. 3 is a plan view illustrating the configuration example of the controller chip 20 and the metallic layer 50. FIG. 2 illustrates a cross-section along a line A-A in FIG. 3.

As illustrated in FIG. 2, the controller chip 20 includes a semiconductor substrate 20a having a front surface F1 as a first face and a back surface F2 as a second face on the opposite side to the front surface F1. Semiconductor elements are provided on the side of the front surface F1 of the semiconductor substrate 20a. The semiconductor elements include a CMOS (Complementary Metal Oxide Semiconductor) circuit 21 constituting a control circuit, and an SRAM 22 temporarily storing therein data in the operation of the CMOS circuit 21. The controller chip 20 may include other semiconductor elements.

The SRAM 22 is formed, for example, in a well diffusion layer W provided in the semiconductor substrate 20a. FIG. 2 illustrates one transistor constituting the SRAM 22. This transistor includes a gate electrode G, a source layer S, and a drain layer D. In FIG. 2, a single of transistor is shown on the side of the surface F1 of the semiconductor substrate 20a. However, not limited to this, a plurality of transistors may be provided thereon.

A concave portion 99 is provided on the side of the back surface F2 of the semiconductor substrate 20a. An insulating film 55 is coated on an inner wall of the semiconductor substate 20a in the concave portion 99. Further, a barrier metal 56 is provided on the insulating film 55. That is, the insulating film 55 is provided between the semiconductor substrate 20a and the metallic layer 50. The barrier metal 56 is provided between the insulating film 55 and the metal layer 50. For example, an insulating material such as a silicon dioxide film is used as the insulating film 55. For example, a metallic material such as a titanium film (Ti), a titanium nitride film (TiN), tantalum film (Ta), or a tantalum nitride film (TaN) is used as the barrier metal 56 being a second metallic layer.

The metallic layer 50 fills the concave portion 99 on the barrier metal 56. That is, the insulating film 55 and the barrier metal 56 thinly coat the inner wall of the semiconductor substrate 20a in the concave portion 99 and the metallic layer 50 fills the concave portion 99 with the insulating film 55 and the barrier metal 56 interposed therebetween. For example, a metallic material such as copper and aluminum is used as the metallic layer 50. Since the insulating film 55 and the barrier metal 56 coat the inner wall in the concave portion 99, the metallic layer 50 is not in direct contact with the semiconductor substrate 20a, the CMOS circuit 21, and the SRAM 22. Accordingly, diffusion of the metallic layer 50 into the semiconductor substrate 20a, the CMOS circuit 21, and the SRAM 22 can be suppressed and metallic contamination can be suppressed.

The metallic layer 50 is arranged right below the SRAM 22 and is arranged in the semiconductor substrate 20a between the SRAM 22 and the wiring substrate 10 as illustrated in FIGS. 1 and 2. The metallic layer 50 is arranged on the side of the back surface F2 to correspond to the SRAM 22 and is embedded into the semiconductor substrate 20a from the back surface F2.

The controller chip 20 is stuck onto the wiring substrate 10 with the adhesive layer 30 while the back surface F2 faces the wiring substrate 10 as illustrated in FIGS. 1 and 2. Since being configured to be substantially on the same plane with the back surface F2 of the semiconductor substrate 20a, the metallic layer 50 can be easily stuck onto the wiring substrate 10 with the adhesive layer 30.

Figure 12:
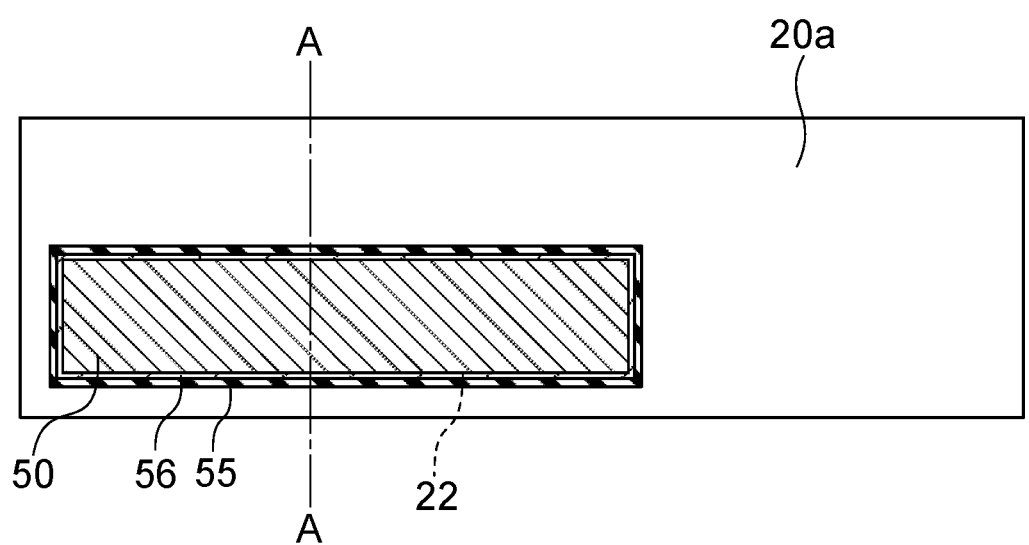
FIG. 12 is a plan view illustrating a configuration example of the controller chip and the metallic layer.

As illustrated in FIGS. 3 and 12, the metallic layer 50 covers the entire region where the SRAM 22 is formed as viewed from a substantially perpendicular direction to the front surface F1 or the back surface F2 of the semiconductor substrate 20a. As illustrated in FIG. 12, in a planar layout, the region where the metallic layer 50 is formed may be substantially the same as the formation region of the SRAM 22. In this case, the outer edges of the formation region of the metallic layer 50 substantially match the outer edges of the formation region of the SRAM 22. Alternatively, the formation region of the metallic layer 50 may be arranged to an outer side of the formation region of the SRAM 22 with a certain margin. In this case, as illustrated in FIG. 3, the outer edges of the formation region of the metallic layer 50 are arranged slightly outside the outer edges of the formation region of the SRAM 22.

In this way, with the metallic layer 50 provided right below the SRAM 22 and arranged between the SRAM 22 and the wiring substrate 10, the SRAM 22 can be protected from alpha rays from the resin layers 11 of the wiring substrate 10.

Figure 4:
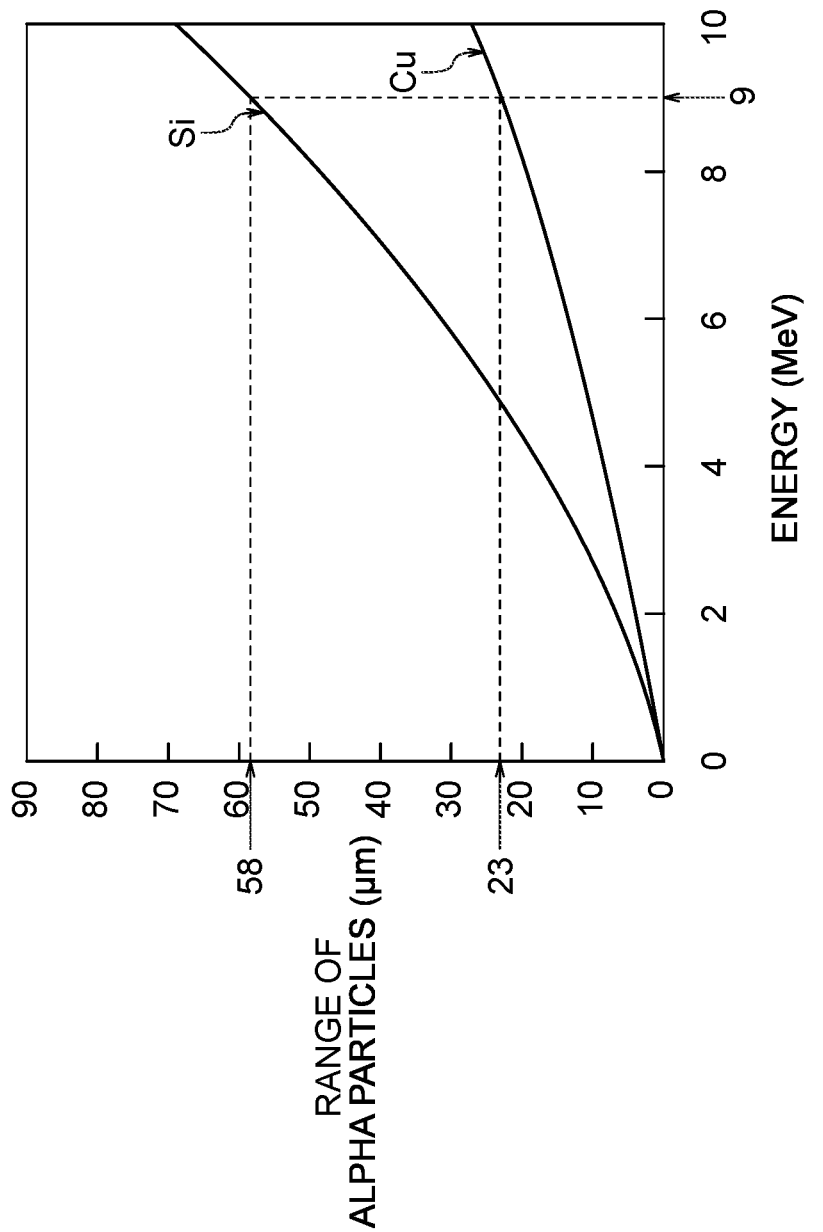
FIG. 4 is a graph illustrating ranges of alpha particles of silicon and copper.

FIG. 4 is a graph illustrating ranges of alpha particles of silicon and copper.

Alpha rays generated from radioactive materials have energy of about 9 megaelectron volts and are one of factors of soft errors of an SRAM. It has been found that these alpha rays are generated from the resin layers 11 containing a glass material and that the alpha rays cause soft errors of the SRAM 22 in the controller chip 20.

As illustrated in FIG. 4, the range of the alpha particles is about 58 micrometers in silicon crystals and is about 23 micrometers in copper. As described above, the range of the alpha particles is shorter in copper than in silicon. Therefore, when the metallic layer 50 made of copper has a thickness of 23 micrometers or more, the metallic layer 50 can absorb the alpha rays from the resin layers 11 and can suppress soft errors of the SRAM 22.

If the metallic layer 50 is not provided, the semiconductor substrate (silicon substrate) 20a is arranged between the SRAM 22 and the wiring substrate 10. In this case, the semiconductor substrate 20a needs to have a thickness of 58 micrometers or more to absorb the alpha rays from the resin layers 11. That is, with provision of the metallic layer 50, the thickness of the semiconductor substrate 20a can be reduced to half or smaller.

The thickness of the metallic layer 50 is preferably not less than 23 micrometers and less than 58 micrometers. This enables the SRAM 22 to be efficiently protected from the alpha rays from the resin layers 11 while decreasing the thickness of the controller chip 20.

As described above, according to the present embodiment, the controller chip 20 includes the metallic layer 50 in the semiconductor substrate 20a between the SRAM 22 and the wiring substrate 10. Therefore, the alpha rays from the wiring substrate 10 can be suppressed from reaching the SRAM 22 even when the thickness of the semiconductor substrate 20a is decreased. For example, in a case in which the metallic layer 50 is copper, the thickness of the semiconductor substrate 20a can be decreased to a value not less than 23 micrometers and less than 58 micrometers. As a result, soft errors of the SRAM 22 in the controller chip 20 can be suppressed while the thickness of the controller chip 20 is decreased. In particular, in the case shown in FIG. 13, when the thickness of the controller chip 20 is reduced, the entire semiconductor device 1 becomes thinner. Therefore, it is possible to reduce the thickness (or reduce the size) of the semiconductor package while suppressing the soft error of the SRAM.

A manufacturing method of the semiconductor device according to the present embodiment is described next.

Figure 5:
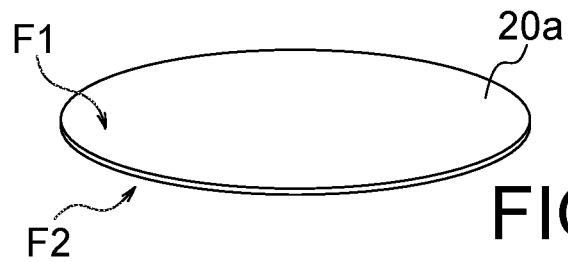
FIG. 5 is a perspective view illustrating an example of a manufacturing method of the semiconductor device according to the present embodiment.

FIG. 5 is a perspective view illustrating an example of the manufacturing method of the semiconductor device according to the present embodiment. FIGS. 6 to 11 are sectional views illustrating the example of the manufacturing method of the semiconductor device according to the present embodiment.

Figure 6:
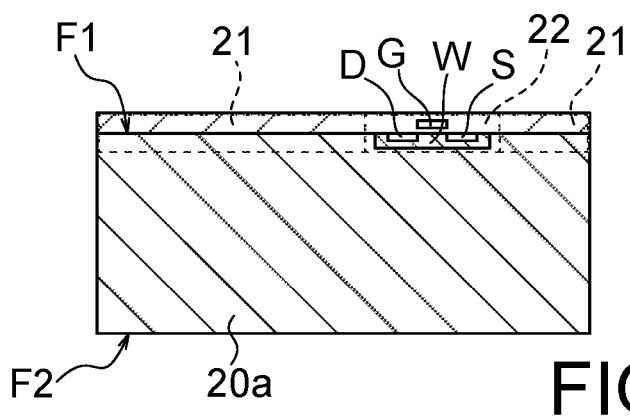
FIG. 6 is a sectional view illustrating an example of the manufacturing method of the semiconductor device following FIG. 5.

First, semiconductor elements are formed on a semiconductor substrate 20a in the form of a wafer illustrated in FIG. 5 using a semiconductor manufacturing process. The semiconductor substrate 20a is, for example, a silicon substrate. The semiconductor elements are, for example, transistors, capacitor elements, resistance elements, and the like. The CMOS circuits 21 and the SRAMs 22 are thereby formed on the side of the front surface F1 of the semiconductor substrate 20a as illustrated in FIG. 6.

Figure 7:
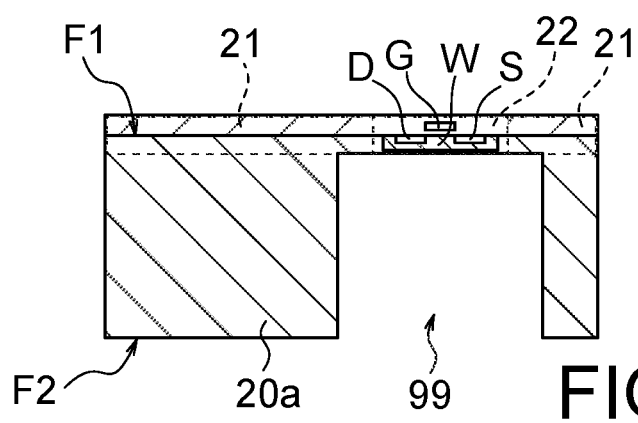
FIG. 7 is a sectional view illustrating an example of the manufacturing method of the semiconductor device following FIG. 6.

Next, the concave portions 99 are formed from the back surface F2 of the semiconductor substrate 20a to inside the semiconductor substrate 20a using a lithography technique, an RIE (Reactive Ion Etching) method, and the like as illustrated in FIG. 7. The concave portions 99 are provided right below the SRAMs 22 and are arranged in regions of the back surface F2 corresponding to the SRAMs 22. As explained with reference to FIG. 3, each of the concave portions 99 covers the entire formation region of the associated SRAM 22 as viewed from above the front surface F1. The concave portions 99 are formed to such a depth that does not affect characteristics of the CMOS circuits 21 and the SRAMs 22. Meanwhile, it is preferable to form the concave portions 99 as deeply as possible to increase the thickness of the metallic layers 50 and decrease the thickness of the semiconductor chip 20 as much as possible. Therefore, the concave portions 99 are formed to such an extent as to cause the semiconductor substrate 20a to remain thinly on the side of the back surface F2 of the CMOS circuits 21 and the SRAMs 22. In a case in which the insulating film 55 is about 0.1 micrometer and the barrier metal 56 is about 0.1 micrometer, which are significantly thin as described later, the depth of the concave portions 99 from the back surface F2 is not less than 23 micrometers and less than 58 micrometers. Some measurement devices include a measurement error depending on environmental conditions where measurement is performed, and the like. Therefore, "about" in the present specification indicates that measurements do not match the associated values in some cases due to the measurement error.

Figure 8:
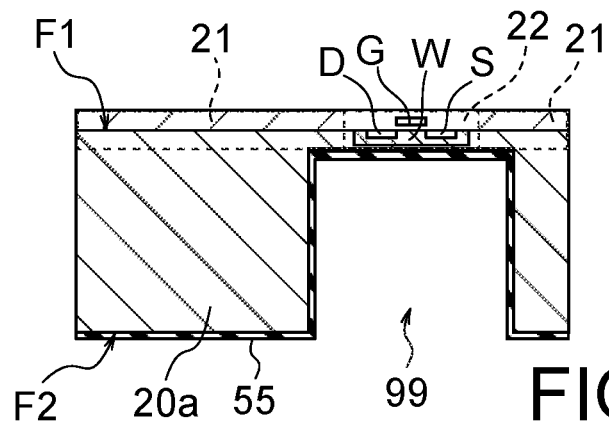
FIG. 8 is a sectional view illustrating an example of the manufacturing method of the semiconductor device following FIG. 7.

Next, as illustrated in FIG. 8, the insulating film (for example, a silicon dioxide film) 55 is deposited on the inner wall of each of the concave portions 99 and on the back surface F2 by a CVD (Chemical Vapor Deposition) method. The thickness of the insulating film 55 is, for example, about 0.1 micrometer. The insulating film 55 electrically insulates the associated metallic layer 50 from the semiconductor substrate 20a.

Figure 9:
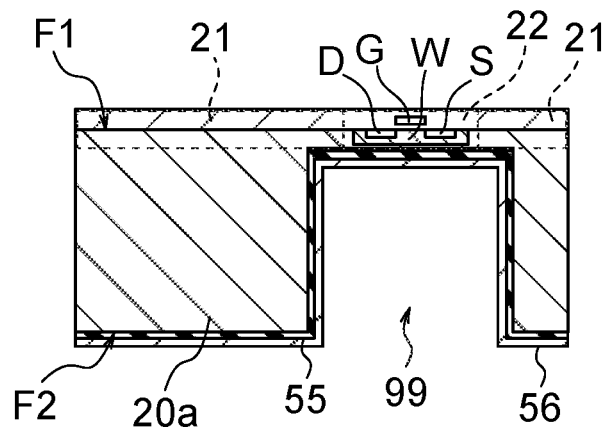
FIG. 9 is a sectional view illustrating an example of the manufacturing method of the semiconductor device following FIG. 8.

Next, as illustrated in FIG. 9, the barrier metal (for example, a titanium nitride film) 56 is deposited on the insulating film 55 in each of the concave portions 99 and on the back surface F2 by a sputtering method or a PVD (Physical Vapor Deposition) method. The thickness of the barrier metal 56 is, for example, about 0.1 micrometer. The barrier metal 56 functions as a seed layer at the time of forming the metallic layers 50 by a plating method. The insulating film 55 and the barrier metal 56 are formed thinly so as not to fill the concave portions 99.

Figure 10:
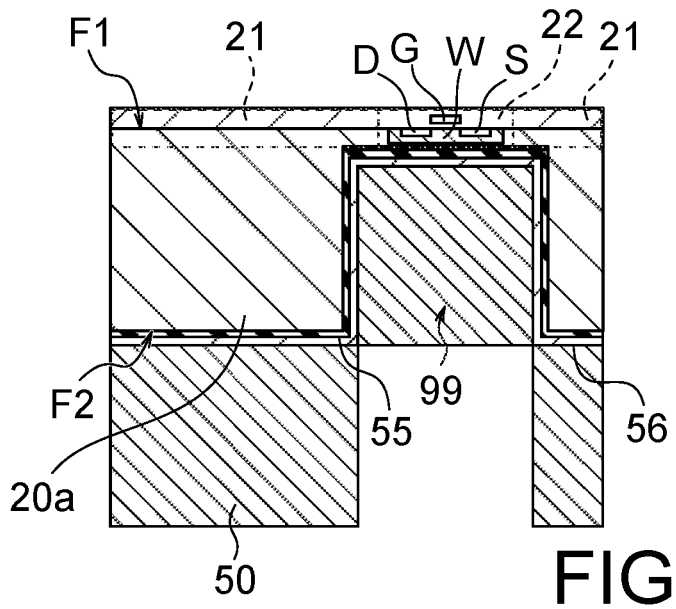
FIG. 10 is a sectional view illustrating an example of the manufacturing method of the semiconductor device following FIG. 9.

Next, as illustrated in FIG. 10, the material (for example, copper) of the metallic layers 50 is deposited in the concave portions 99 and on the back surface F2 of the semiconductor substrate 20a by an electrolytic plating method, or the like. Accordingly, the material of the metallic layers 50 is formed to fill the concave portions 99. The thickness of the metallic layers 50 is not less than 23 micrometers and less than 58 micrometers.

Figure 11:
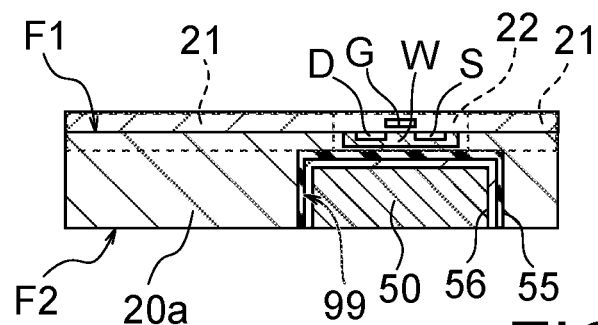
FIG. 11 is a sectional view illustrating an example of the manufacturing method of the semiconductor device following FIG. 10.

Next, the metallic layer 50, the barrier metal 56, and the insulating film 55 are polished using a CMP (Chemical Mechanical Polishing) method until the back surface F2 of the semiconductor substrate 20a is exposed. A structure illustrated in FIG. 11 is thereby obtained. At this time, the thickness of the metallic layers 50 is preferably not less than 23 micrometers and less than micrometers. This enables the thickness of the semiconductor device 1 to be as thin as possible while the metallic layers 50 absorb the alpha rays from the wiring substrate 10.

Next, the semiconductor substrate 20a in the form of a wafer is singulated into the controller chips 20 by a blade dicing method or a laser dicing method although not illustrated. The controller chips 20 are thereby completed. The memory chips 60 are also formed through a semiconductor manufacturing process and a dicing method.

Next, the adhesive layer 30 is attached to the back surface F2 of the controller chip 20 to attach the controller chip 20 onto the wiring substrate 10 as illustrated in FIG. 1. The semiconductor device shown in FIG. 13 can be manufactured in substantially the same manner as the semiconductor device shown in FIG. 1, although the position where the controller chip 20 is attached to the semiconductor device is different between FIG. 13 and FIG. 1. The memory chips 60 are also attached onto the wiring substrate 10 with the associated adhesive layers 30. In the present embodiment, the controller chip 20 is attached onto the wiring substrate 10 with the adhesive layer 30 with no memory chip 60 interposed therebetween. The controller chip 20 is positioned right above the wiring substrate 10 and the back surface F2 of the controller chip 20 faces the top surface of the wiring substrate 10. At this time, the metallic layer 50 is positioned between the associated SRAM 22 and the wiring substrate 10 and can protect the SRAM 22 from the alpha rays from the wiring substrate 10.

Subsequently, electrode pads on the controller chip 20 and the associated memory chips 60 are respectively connected to electrode pads on the wiring substrate 10 with the metallic wires 40. The metallic wires 40 are, for example, gold wires.

Next, the controller chip 20, the memory chips 60, and the metallic wires 40 are sealed with the resin layer 80. Accordingly, the resin layer 80 can cover and protect the controller chip 20, the memory chips 60, and the metallic wires 40.

Thereafter, the wiring substrate 10 is diced using the blade dicing method or the laser dicing method to singulate the semiconductor devices 1. Packages of the semiconductor device 1 according to the present embodiment are thereby completed.

As described above, according to the present embodiment, the metallic layer 50 can be formed between the SRAM 22 of the controller chip 20 and the wiring substrate 10. Accordingly, the metallic layer 50 can suppress the alpha rays from the resin layers 11 containing a grass material of the wiring substrate 10 from reaching the SRAM 22 while the thickness of the semiconductor substrate 20a is decreased. That is, soft errors of the SRAM 22 of the controller chip 20 can be suppressed while the thickness of the controller chip 20 is decreased. Downscaling of the SRAM 22 and reduction in the soft error rate can both be achieved.

The present embodiment is particularly effective in a case in which the controller chip 20 is arranged near the wiring substrate 10.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a wiring substrate; and
   a semiconductor chip comprising a semiconductor substrate comprising a first face and a second face on an opposite side to the first face, and an SRAM (Static Random Access Memory) on a side of the first face, and being stuck to the wiring substrate on a side of the second face, wherein
   the semiconductor chip comprises a first metallic layer provided in the semiconductor substrate between the SRAM and the wiring substrate, an insulating film provided between the semiconductor substrate and the first metallic layer, and a second metallic layer provided between the insulating film and the first metallic layer, and
   the first metallic layer entirely covers the SRAM as viewed from a direction perpendicular to the second face.

2. The device of claim 1, further comprising a memory chip provided in a first region on the wiring substrate, wherein
   the semiconductor chip is provided in a second region on the wiring substrate, and
   the semiconductor chip controls the memory chip.

3. The device of claim 2, wherein the first metallic layer contains copper or aluminum.

4. The device of claim 2, wherein the first metallic layer has a thickness not less than 23 micrometers and less than 58 micrometers.

5. The device of claim 2, wherein
   the wiring substrate comprises a wiring layer, and
   the device further comprises a metallic wire electrically connecting the semiconductor chip and the wiring layer to each other.

6. The device of claim 2, wherein the first metallic layer entirely covers the SRAM as viewed from a direction perpendicular to the second face.

7. The device of claim 1, further comprising a memory chip provided above the wiring substrate, wherein
   the semiconductor chip is provided between the wiring substrate and the memory chip, and
   the semiconductor chip controls the memory chip.

8. The device of claim 7, further comprising an adhesive layer, wherein the adhesive layer comprises a first portion sticking the second face and the wiring substrate to each other, a second portion sticking the memory chip and the wiring substrate to each other, and a third portion sticking the memory chip and the semiconductor chip to each other.

9. The device of claim 7, wherein the first metallic layer contains copper or aluminum.

10. The device of claim 3, wherein the first metallic layer has a thickness not less than 23 micrometers and less than 58 micrometers.

11. The device of claim 3, wherein
    the wiring substrate comprises a wiring layer, and
    the device further comprises a metallic wire electrically connecting the semiconductor chip and the wiring layer to each other.

12. The device of claim 1, wherein the first metallic layer contains copper or aluminum.

13. The device of claim 1, wherein the first metallic layer has a thickness not less than 23 micrometers and less than 58 micrometers.

14. The device of claim 1, wherein
    the wiring substrate comprises a wiring layer, and
    the device further comprises a metallic wire electrically connecting the semiconductor chip and the wiring layer to each other.

15. The device of claim 1, wherein the wiring substrate contains glass.

16. The device of claim 1, further comprising an adhesive layer sticking the second face of the semiconductor chip and the wiring substrate to each other.

17. The device of claim 16, wherein a face of the first metallic layer on a side of the wiring substrate is in a same plane as the second face of the semiconductor chip, and the adhesive layer sticks the first metallic layer and the wiring substrate to each other.

18. The device of claim 1, wherein the insulating film comprises silicon and oxygen, and the second metallic layer contains either titanium or tantalum.

* * * * *